United States Patent
Foisy et al.

(10) Patent No.: US 9,217,774 B2
(45) Date of Patent: Dec. 22, 2015

(54) CYCLE-ACCURATE REPLAY AND DEBUGGING OF RUNNING FPGA SYSTEMS

(71) Applicant: International Business Machines Corporation, Armonk, NY (US)

(72) Inventors: Daniel Foisy, Pickering, CA (US); Sunil K. Shukla, Dobbs Ferry, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/473,058

(22) Filed: Aug. 29, 2014

(65) Prior Publication Data

US 2015/0128100 A1    May 7, 2015

Related U.S. Application Data

(60) Provisional application No. 61/898,878, filed on Nov. 1, 2013.

(51) Int. Cl.
  *G06F 11/22* (2006.01)
  *G06F 17/50* (2006.01)
  *G01R 31/3185* (2006.01)

(52) U.S. Cl.
  CPC .... *G01R 31/318519* (2013.01); *G06F 17/5018* (2013.01)

(58) Field of Classification Search
  USPC .......................................................... 716/136
  See application file for complete search history.

(56) References Cited

U.S. PATENT DOCUMENTS

| 6,285,914 B1 | 9/2001 | Bae et al. |
| 7,480,610 B2 * | 1/2009 | Scott et al. ...................... 703/23 |
| 8,479,132 B2 | 7/2013 | Tsai et al. |
| 8,566,768 B1 | 10/2013 | Shukla et al. |

OTHER PUBLICATIONS http://www.cerc.utexas.edu/itc99-benchmarks/bench.html, "ITC99 Benchmark Home Page" printed Oct. 18, 2013.
http://en.wikipedia.org/wiki/Reliability,_availability_and_serviceability_(computer_hardware), "Reliability, availability and serviceability (computer hardware)" printed Oct. 18, 2013.
http://en.wikipedia.org/wiki/GZIP, "gzip" printed Jul. 28, 2014.
http://en.wikipedia.org/wiki/Data_Encryption_Standard, "Data Encryption Standard" printed Jul. 28, 2014.
http://en.wikipedia.org/wiki/User_Datagram_Protocol, "User Datagram Protocol" printed Jul. 28, 2014.
http://en.wikipedia.org/wiki/Mersenne_twister, "Mersenne twister" printed Jul. 28, 2014.

(Continued)

*Primary Examiner* — Eric Lee
(74) *Attorney, Agent, or Firm* — Scully, Scott, Murphy & Presser, P.C.; Gail H. Zarick, Esq.

(57) ABSTRACT

As described herein, a tool records a log (or trace) of all sources of non-determinism in the system. In most of the cases, it's enough to log all transitions and the exact timestamps at all the entry and exit points of the system. By using this information it is possible to recreate a cycle accurate execution of the hardware system in simulation. Unlike CHIPSCOPE and SIGNALTAP which let you monitor a small number of signals in the design, the tool provides visibility into the whole system.

14 Claims, 12 Drawing Sheets

(56) References Cited

OTHER PUBLICATIONS

"Technical Data for CLAM System for Actel FPGA Devices", pp. 1-2.

http://www.eetimes.com/authorasp?section_id=36&doc_id=1284571, "Debugging FPGAs at full speed", printed Aug. 29, 2014.

Putnam, A. et al., "A Reconfigurable Fabric for Accelerating Large-Scale Datacenter Services", Jun. 2014, pp. 1-12.

Kim, D. et al., "Trace-Driven HW/SW Cosimulation Using Virtual Synchronization Technique", Jun. 2005, pp. 1-4.

"ChipScope Pro Software and Cores—User Guide", www.xilinx.com, (Oct. 16, 2012), UG029 (v14.3), pp. 1-226.

Altera Corporation, "Chapter 13: Design Debugging Using the SignalTap II Logic Analyzer", Quartus II Handbook Version 13.1, (Nov. 2013), vol. 3: Verification, 70 pages.

Altera Corporation—University Program, "SignalTap II with VHDL Deigns", for Quartus 11 13.0, (May 2013), pp. 1-21.

Liu, D., et al., "TERA: A FPGA-Based Trace-Driven Emulation Framework for Designing On-Chip Communication Architectures", SOC Conference (SOCC), (Sep. 27-29, 2010), pp. 182-187.

Altera Corporation, "Chapter 13: Design Debugging Using the SignalTap II Logic Analyzer", Quartus II Handbook Version 13.0, (May 2013), vol. 3: Verification, 70 pages.

* cited by examiner

| BENCHMARK | DEBUG CHANNELS | CHANNEL WIDTHS (BYTES) |
|---|---|---|
| DES | 2 | 16, 16 |
| GZip | 2 | 16, 16 |
| MERSENNE | 2 | 16, 16 |
| N-BODY | 2 | 16, 16 |
| UDP | 4 | 14, 8, 16, 16 |
| MEMOCODE2013 | 6 | 69, 64, 32, 32, 16, 16 |

BENCHMARKS

| BENCHMARK | BASE | CHIPSCOPE | INVENTIVE TOOL /BRAM | | INVENTIVE TOOL /SRAM | | INVENTIVE TOOL /DRAM | |
|---|---|---|---|---|---|---|---|---|
| | | | APP | INVENTIVE TOOL | APP | INVENTIVE TOOL | APP | INVENTIVE TOOL |
| DES | 125 | 125 | 125 | 166 | 125 | 166 | 125 | 166 |
| GZip | 115 | 115 | 115 | 166 | 115 | 166 | 115 | 166 |
| MERSENNE | 120 | 117 | 120 | 166 | 120 | 166 | 120 | 166 |
| N-BODY | 90 | 90 | 90 | 143 | 90 | 166 | 90 | 166 |
| UDP | 156 | 156 | 156 | 100 | 156 | 150 | 156 | 150 |
| MEMOCODE2013 | 100 | 100 | 100 | 100 | 100 | 125 | NA | NA |

MAXIMUM SYNTHESIZED CLOCK FREQUENCY (MHz). MERSENNE INSTRUMENTED WITH CHIPSCOPE FAILED TO MEET THE TIMING BUDGET. FOR MEMOCODE2013, INVENTIVE TOOL/DRAM CONFIGURATION IS NOT VALID BECAUSE DRAM IS USED BY THE USER APPLICATION.

FIG. 6

| BENCHMARK | CHIPS COPE | | INVENTIVE TOOL | | INVENTIVE TOOL/BRAM | | INVENTIVE TOOL/SRAM | | INVENTIVE TOOL/DRAM | |
|---|---|---|---|---|---|---|---|---|---|---|
| | LOGGED | STATUS | LOGGED | STATUS | LOGGED | STATUS | LOGGED | STATUS | LOGGED | STATUS |
| DES | 262 KB | OVERFLOW | 393 KB | OVERFLOW | 2.48 MB | COMPLETED | 2.48 MB | COMPLETED |
| GZip | 262 KB | OVERFLOW | 393 KB | OVERFLOW | 9.43 MB | DROP @ 189 s | 49.3 MB | COMPLETED |
| MERSENNE | 262 KB | OVERFLOW | 393 KB | OVERFLOW | 37.6 KB | DROP @ 1.5 ms | 23.0 MB | COMPLETED |
| N-BODY | 262 KB | OVERFLOW | 393 KB | OVERFLOW | 1.78 MB | COMPLETED | 1.78 MB | COMPLETED |
| UDP | 458 KB | OVERFLOW | 721 KB | OVERFLOW | 9.43 MB | OVERFLOW | 103.7 MB | COMPLETED |
| MEMOCODE | 116 KB | OVERFLOW | 155 KB | DROP @2.3 ms | 167 KB | DROP @2.55 ms | N/A | N/A |

LOG SIZE RECORDED

FIG. 7

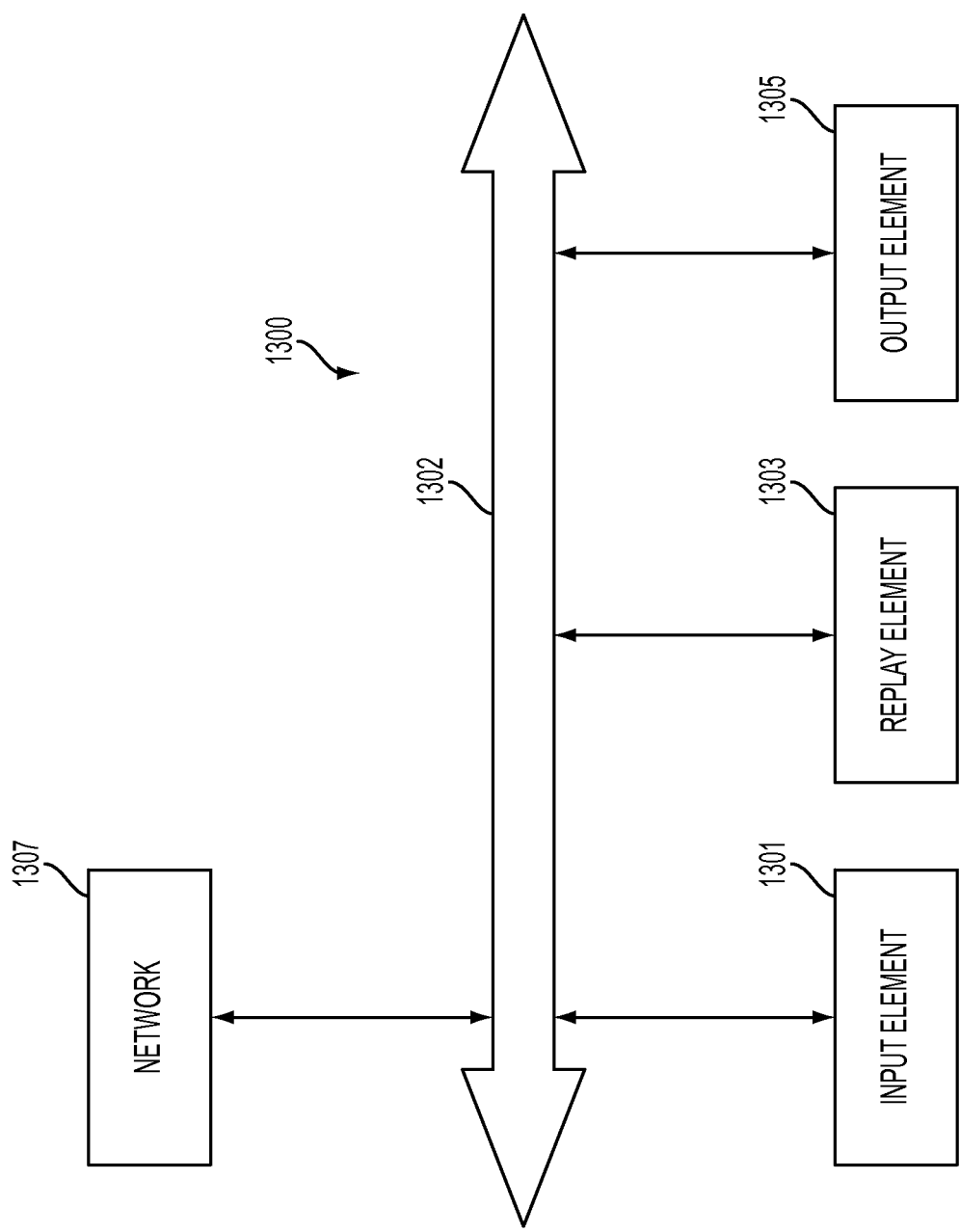

CYCLE-ACCURATE REPLAY AND DEBUGGING OF RUNNING FPGA SYSTEMS

RELATED APPLICATION

The present application claims the benefit of U.S. provisional patent application 61/898,878, filed Nov. 1, 2013, the entire content and disclosure of which is incorporated herein by reference.

BACKGROUND

There are several tools available for verification of hardware description language (HDL) designs in simulation. Most of the functional bugs can be detected and fixed in simulation where each bit in the design can be observed at every clock transition. However, once the design goes into field-programmable gate array (FPGAs) the observability is typically reduced.

The most difficult bugs to find are those that are difficult to reproduce. These are typically due to either unexpected data values that occur in deployment (but not in testing) or to subtle timing-dependent properties that are due to non-deterministic behavior of various physical components of the system.

Generally tools are used to record values of various signals in the chip instead of a simulation program.

SUMMARY

In one aspect of the present invention a method is implemented at least in part in a field-programmable gate array (FPGA) for analyzing the FPGA is provided, the method comprising: determining, by the FPGA, a plurality of events that occur in the FPGA; associating, by the FPGA, a timestamp with each of the determined events; and creating, by the FPGA, a log of the events and respective timestamps.

In another embodiment a computer program product for analyzing a field-programmable gate array (FPGA) is provided, the computer program product comprising a computer readable storage medium having program instructions embodied therewith, the program instructions executable at least in part by the FPGA to cause the FPGA to perform a method comprising: determining a plurality of events that occur in the FPGA; associating a timestamp with each of the determined events; and creating a log of the events and respective timestamps.

In another aspect of the present invention, a computer-implemented system for analyzing a field-programmable gate array (FPGA) based upon a log of FPGA events and respective timestamps is provided, the system comprising: an input element configured to receive the log, a replay element configured to utilize the log to replay a prior FPGA execution in a simulation; and an output element configured to output the simulation.

BRIEF DESCRIPTION OF THE DRAWINGS

Various objects, features and advantages of the present invention will become apparent to one skilled in the art, in view of the following detailed description taken in combination with the attached drawings, in which:

FIG. 6 depicts a maximum synthesized clock frequency table according to an embodiment of the present invention.

FIG. 7 depicts a log size recorded table according to an embodiment of the present invention.

FIG. 13 depicts a block diagram of a system according to an embodiment of the present invention.

DETAILED DESCRIPTION

Figure 1:
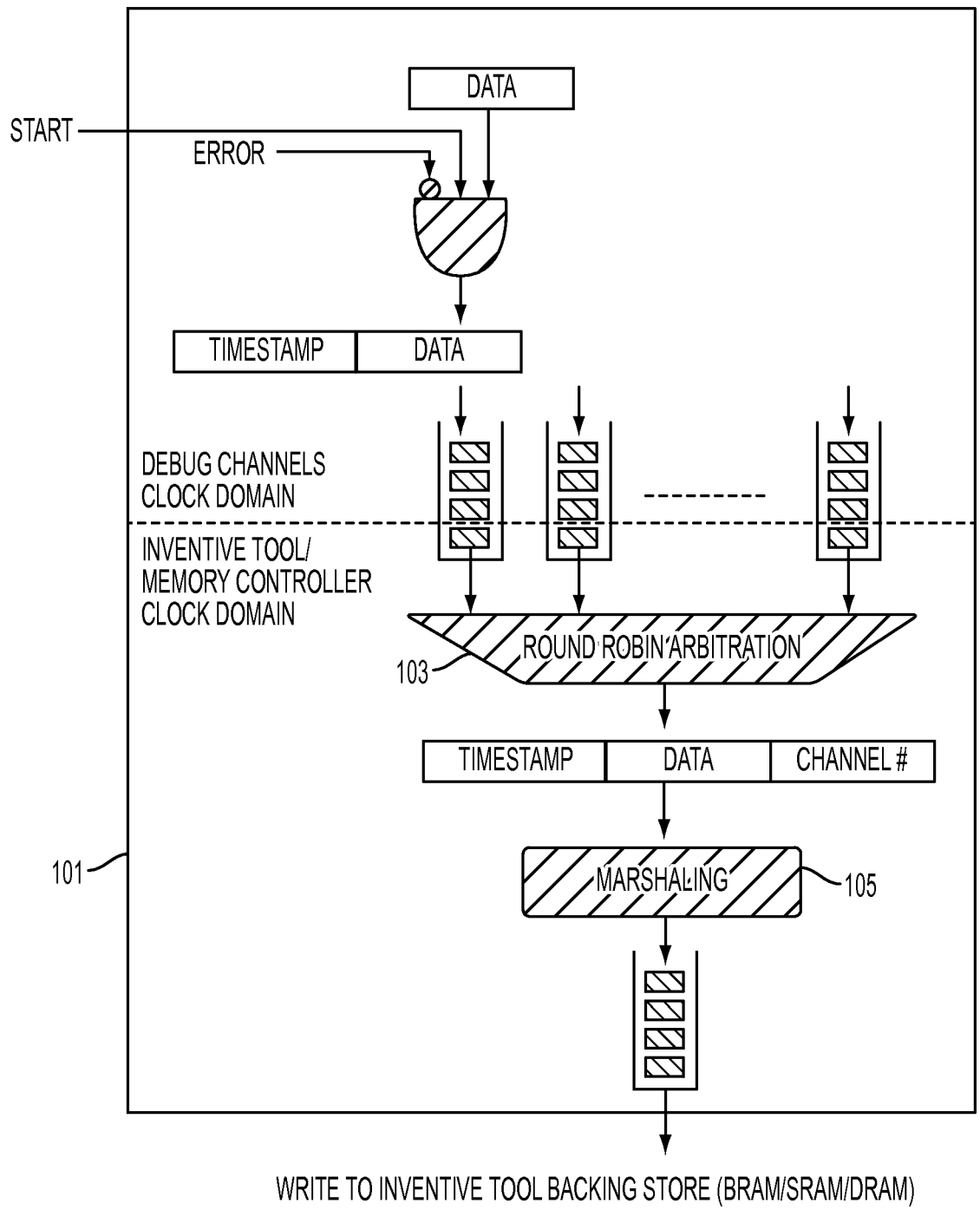
FIG. 1 depicts a block diagram of a tool framework according to an embodiment of the present invention.

As described herein, a tool, also referred to as the inventive tool framework or the inventive tool, records a log, or trace of all sources of non-determinism in the system. In most of the cases, it's enough to log all transitions and the exact timestamps at all the entry and exit points of the system. By using this information it is possible to recreate a cycle accurate execution of the hardware system in simulation. Unlike CHIPSCOPE (ChipScope Pro software and cores. Tech. Rep. UG029(v14.3), XILINX, October 2012) and SIGNALTAP (ALTERA SIGNALTAP (Design debugging using Signal-TapII logic analyzer. Tech. Rep. QII53009-13.0.0, Altera, May 2013. Quartus II Handbook, Chap. 13)) which let you monitor a small number of signals in the design, various embodiments of the inventive tool provide visibility into the whole system.

Various embodiments of the inventive tool provide a number of benefits. First, a failing execution can be replayed as often as needed to find the source of the problem. Second, the developer has full visibility into the design, and can examine the value of any signal in the simulator (in one example, you would only need to use certain events in the design and then you could see anything in hardware in the simulation). Hypotheses can be quickly formed, tested, and revised. This essentially takes away the guess work and significantly reduces failure to recovery time.

According to the present invention, in such a cycle-accurate replay system, when the log becomes full, the ability to replay can come to an end. This issue can be reduced by providing the ability to stream the log to DRAM and/or SRAM, which provides an expanded capacity (e.g., over the on-chip BRAM used by tools like CHIPSCOPE).

According to the present invention, there is a possibility of certain delays: at some point the off-chip buffer can overflow. However, it has been found that many problems can be effectively diagnosed with the buffer sizes available.

According to an embodiment of the present invention, for bugs that manifest only in long executions, the inventive tool could be extended with snapshot-based techniques (e.g. S. G. Hanono. InnerView hardware debugger: A logic analysis tool for the virtual wires emulation system. Master's thesis, MIT, 1995), although the snapshot itself would constitute a possibly significant probe effect.

Reference will now be made to the design and implementation of a tool framework according to one embodiment. In this example, the inventive tool framework comprises two components: an FPGA-based runtime component and a host-based trace processor called inventive tool Player. The FPGA-based runtime component does data logging and retrieval during execution either in a software-hardware (SW-HW) codesign system or in a standalone hardware system. The inventive tool Player comprises a harness which uses the trace to do a system level simulation to replay the FPGA execution in a cycle accurate manner. The harness itself can be written in a high level language and hooked to the HDL code of the design-under-test (DUT) via programming language interface (PLI), or written entirely in HDL.

Referring to the on-chip component, the instrumentation embedded into the user design in FPGA comprises three components which handle logging of debug data on multiple channels, storage, and readback. The on-chip component includes a recorder, a backing store, and a reader as described below.

The inventive tool recorder supports a configurable number of debug channels and channel bit-widths. Also each debug channel can belong to a completely different clock domain. A high level block diagram of recorder 101 is shown in FIG. 1. FIG. 1 shows the primary control signals and data signals for debug channel 0 (the rest of the signals have not been included in order to simplify the diagram). The recorder is controlled by a global signal Start. Any debug data arriving before Start is asserted is ignored. Debug data on each channel is timestamped and queued in an asynchronous FIFO. The FIFO serves two roles: acting as a temporary storage, and facilitating clock domain crossing of the debug data from debug clock domain to the inventive tool clock domain. Also, each queue can be individually sized at compile time to match the rate at which data is transacted at each interface. In various experiments (described below) each queue was set to store 512 items.

Referring to FIG. 1, the recorder selects one of the debug queues using an eager Round-Robin topology 103; selecting the first non-empty debug queue in a circular manner. Fairness in channel selection may be ensured by selecting a channel for just 1 clock cycle. A weighted scheduling topology is also built in the arbiter. The data retrieved from the FIFO is prefixed with the channel identifier. Since each debug channel can have an arbitrary data width which can be different from the width (burst size) of the backing store, data is fed to a marshaller 105 which produces output matching the width (burst size) of the backing store. Output of the marshaller is enqueued in a FIFO. Data from the FIFO is then sent to the memory controller to be written into the backing store.

The recorder 101 is instrumented with a number of statistic counters per debug channel which keep track of events such as total number of transactions, number of dropped transactions, time of first drop, etc. These counters are quite costly (in terms of hardware) but very valuable because it is important to precisely know if data has been dropped on any channel and the timing of it. The trace is only useful until the point no data is dropped on any channel. It becomes useless after the time data has been dropped because after that point it is not possible to replay the execution with high fidelity.

The recorder generates an Error signal whenever one of the following conditions occurs: 1) data on one of the channels is dropped; 2) the backing store becomes full. The Error signal is used to mask any further write of debug data into the queues. When condition 1 occurs, all the pending data from the queues is drained into the backing store. However, in condition 2 any data in the queues and the internal registers is discarded.

Referring now to the backing store, the inventive tool can be configured to use different types of backing stores, based on on-chip and/or off-chip memories. FPGA boards very frequently have a number of off-chip memory modules such as SRAM, DRAM, Flash, etc. and often all memory modules are not used by the user application. Under such conditions, users can easily exploit the unused off-chip memory module and use it as the inventive tool backing store. In cases where off-chip memory is unavailable, either because it is being used by the application or there may not be one present on the board, on-chip BRAMs can be used as the backing store.

Figures 2, 3:
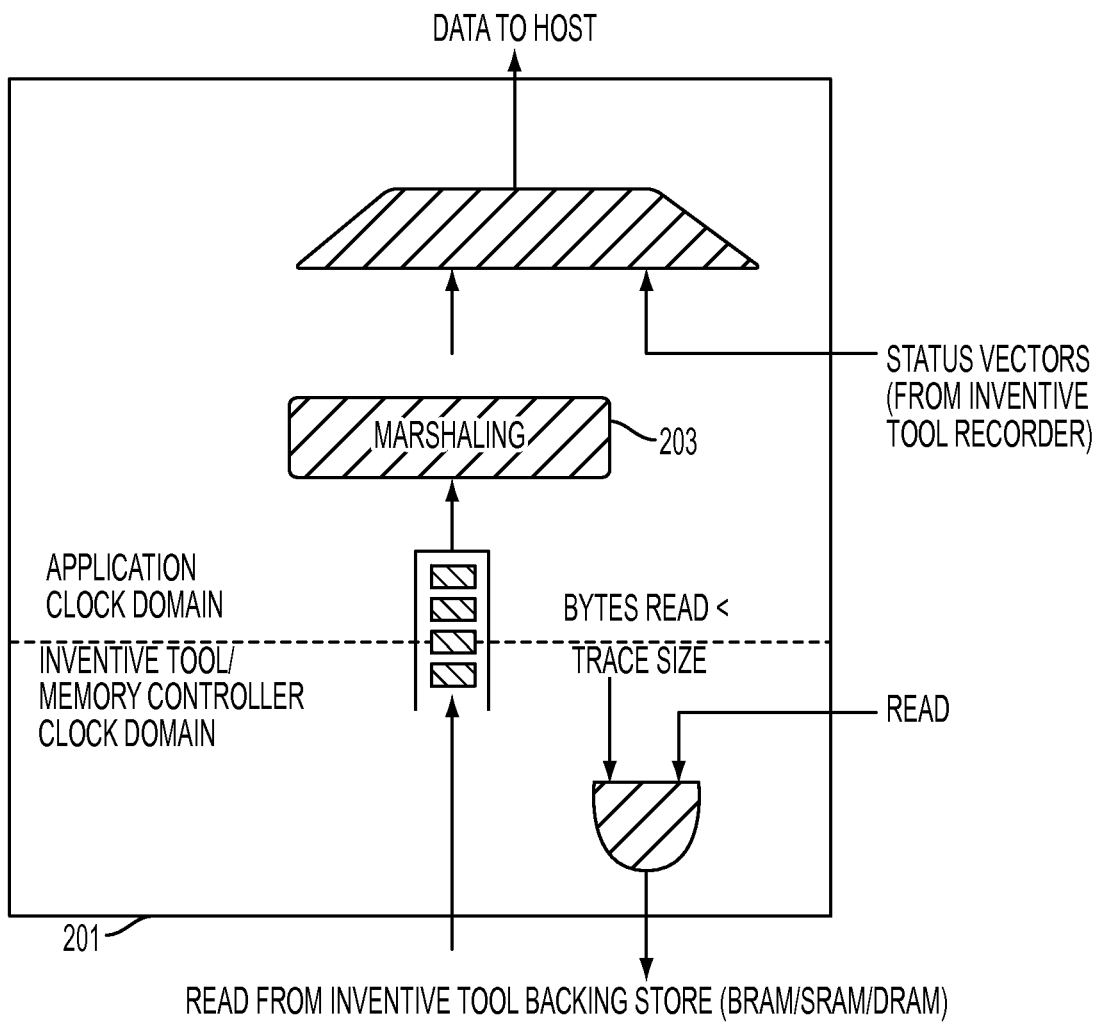
FIG. 2 depicts a block diagram of a tool framework according to an embodiment of the present invention.
FIG. 3 depicts a benchmark table according to an embodiment of the present invention.

Referring now to the inventive tool reader, the reader is responsible for reading the trace from the backing store and sending it to the host. The trace readback is controlled by a Read signal. The Read is controlled by the host via a register write. FIG. 2 shows a simplified block diagram of the reader module 201. The reader generates a read request and a read address for the backing store until all the trace has been read. The trace received from the backing store is queued in an asynchronous FIFO to send the data from the inventive tool clock domain to the application logic clock domain. The data is then marshalled 203 to convert the width which corresponds to the memory width (burst size) to the communication channel width.

With regard now to the host-based trace processor, or inventive tool player, a simulation framework is provided to replay the execution in HDL simulation using the trace obtained from FPGA. In this example, the player comprises a SYSTEMVERILOG harness which reads the trace, generates test vectors for the design, and verifies the result. Since the trace provides precise timing information for all the interfaces, the harness not only generates data and verifies result but also verifies the exact timing of the each input and output transaction. The simulation uses the same set of design files as used for synthesis. Since this example drives all the external interfaces of the design under test, this example can run simulation, view and debug any signal in the design in the same way as for functional simulation.

Reference will now be made to a number of case studies. In these case studies, several functional and runtime failures in FPGA systems have been analyzed using the inventive tool for applications written natively in HDL as well as in LIME (from IBM) HLS framework, which is discussed below.

In the first case study, while testing the MERSENNE TWISTER application, an algorithm for pseudo random number generation), it was found that after running the application for some time the user application in the FPGA started returning malformed packets to the host. This led to a null pointer exception in the LIME harness. No conclusive analysis could be done based on the data log at the host side. The design was instrumented with the inventive tool and it was found that the user application produced a very large amount of data in response to a trigger from the host. However, the host was not draining data from the FPGA fast enough. This led to back-pressure being applied from the FPGA service layer to the user application layer. With the inventive tool it was confirmed that packets were being correctly generated by the user application layer but most likely being corrupted by the FPGA service layer. Since the FPGA service layer was provided by a third party the problem was circumvented by operating at larger packet sizes.

The second case was a bug in the DRAM controller for the MEMOCODE 2013 design (Memocode is a conference which organizes a design competition every year; Memocode2013 refers to the design problem which was a part of the Memocode 2013 design contest). The user design consists of a compute kernel and a load store unit (LSU). The LSU is responsible for fetching data from DRAM and storing the result from the compute kernel into DRAM. This MEMO-CODE design is very memory-intensive, requiring 320B of data to fire the compute kernel which produces a 64B result. The compute kernel is fully pipelined so it can accept 320B every cycle and produce a 64B result. To maximize computational throughput, the LSU was designed to generate a read request every cycle. Although the design worked correctly in simulation, the test never finished execution in the FPGA. The only difference was that simulation used an ideal behavioral model of the memory controller and memory. Using the inventive tool it was found that after accepting and serving several read requests, the memory controller stopped returning any data. This caused the LSU state machine to deadlock waiting for the data from memory. As a remedial measure the LSU was throttled to work in short bursts, pausing after producing a small number of read requests and waiting for all the requests to be served. Throttling the design had no effect on the overall performance because the memory bandwidth was able to be saturated even with a throttled design.

The third case is related to a networking interface. A 10G MAC and UDP core (UDP is a network protocol) were licensed from a third party to develop a network-based application. Initially, loopback testing was used to measure the latency and throughput of the 10G link. The latency test iteratively does a blocking send followed by a blocking receive, and the throughput test spawns separate send and receive threads which act concurrently. The latency test worked fine in this setup but the throughput test failed after sending and receiving a few packets. WIRESHARK was used to monitor the 10G interface at the host side and the FPGA design was instrumented with the inventive tool. Initially the bug was suspected to be in one of the network stack layers in the FPGA. However, both WIRESHARK and the inventive tool showed the same number of outgoing and incoming packets. Thus it was verified that the FPGA was operating correctly, and the problem resided in the host user software code or in the networking stack of the host CPU's Ethernet card.

Reference will now be made to an experimental methodology in which the inventive tool was evaluated using 6 benchmarks: DES (DES is data encryption standard), GZIP (GZIP is encryption standard), MERSENNE, N-BODY, UDP, and MEMOCODE2013. Four out of the six benchmarks: DES, GZIP, MERSENNE, and N-BODY were written entirely in LIME (J. Auerbach et al. A compiler and runtime for heterogeneous computing. In DAC, pp. 271-276, 2012). These programs were then compiled via the LIQUID METAL (from IBM) HLS tool to generate VERILOG, which is then synthesized using FPGA vendor synthesis tools. The UDP benchmark implements echo on an incoming UDP stream. The echo function was written in LIME but the UDP framer and deframer were implemented directly in VERILOG. MEMOCODE2013 (E. Nurvitadhi. Memocode 2013 hardware/software co-design contest: Stereo matching. In MEMOCODE, 2013) benchmark is based on the design contest organized as a part of the MEMOCODE 2013 conference. The MEMOCODE2013 design was entirely implemented in VERILOG.

These benchmarks were chosen from different application domains and were good representatives of the type of applications implemented on FPGAs. These benchmarks were chosen so that the applicability of the inventive tool could be demonstrated with different number and size of debug channels. The Table of FIG. 3 shows the inventive tool configurations for different benchmarks. DES, GZIP, MERSENNE, and N-BODY each have 2 debug channels of 16B width. UDP has 4 debug channels of width 14B, 8B, 16B, and 16B respectively. MEMOCODE2013 has 6 channels of width 69B, 64B, 32B, 32B, 16B, and 16B respectively.

Each of the benchmarks was paired with XILINX CHIPSCOPE and three different inventive tool configurations: (1) the inventive tool with BRAM, (2) the inventive tool with SRAM, (3) the inventive tool with DRAM. CHIPSCOPE ILA and ICON cores (CHIPSCOPE PRO software and cores. Tech. Rep. UG029(v14.3), Xilinx, October 2012) for different configurations were generated using XILINX COREGEN tool. The CHIPSCOPE ILA cores for all the benchmarks, except MEMOCODE2013, have sample data depth of 8192. For MEMOCODE2013 a depth of 1024 was used because for any other configuration the large number of debug channels and wide data path resulted in over mapping of BRAM resources. To ensure fair comparison, the inventive tool /BRAM configuration was set to have the same amount of storage, albeit in different aspect ratio. Also, the data width of the backing store in the inventive tool /BRAM was set to 16B. This is a compile time parameter and users can set a data width which suits the applications requirement. The inventive tool /BRAM depth is adjusted so that the total available storage is same as the storage used by the CHIPSCOPE ICON cores collectively. In case of the inventive tool /SRAM and the inventive tool /DRAM the memory configuration used was that provided by the FPGA board.

For these experiments, a NALLATECH PCIE287 (Nallatech. Nallatech PCIe-287 FPGA network processing card, March 2013. NT190-0461 version 1.7) board was used which consists of 2 XILINX KINTEX7 K325T FPGAS. The KINTEX7 K325T is a mid-range 7-Series FPGA device consisting of 50,950 Slices, 840 DSP Slices, and 890 18 Kb BRAMs (Xilinx 7 series FPGAs overview. Tech. Rep. DS180, Xilinx, July 2013). Each FPGA on the PCIe287 board is connected to a bank of 1 GB DDR3 SDRAM and 3 banks of 9 MB QDR-II SRAM. The board provides 8-lane PCIe 2.0 interface to connect with the host machine. Each user FPGA on the board is also connected to 2 1G/10G Ethernet ports. XILINX ISE 14.5 was used for synthesis and bitstream generation.

An analysis of the results is given below. The first analysis is of the static measurements of the 4 synthesized configurations. For resource utilization (Slices and BRAMs) the four non-networking LIQUID METAL benchmarks (DES, GZIP, MERSENNE, and N-BODY) were almost identical, which is not surprising since they are instrumented with the same width and number of debug channels. Therefore presented is just one averaged set of measurements for these quantities, labeled "LIQUID METAL/PCIe" in FIG. 4.

Also note that since the MEMOCODE benchmark itself makes use of DRAM, and the DRAM channels are being logged, the DRAM can not be used for logging. Therefore DRAM results for MEMOCODE are labeled "N/A".

Figure 4:
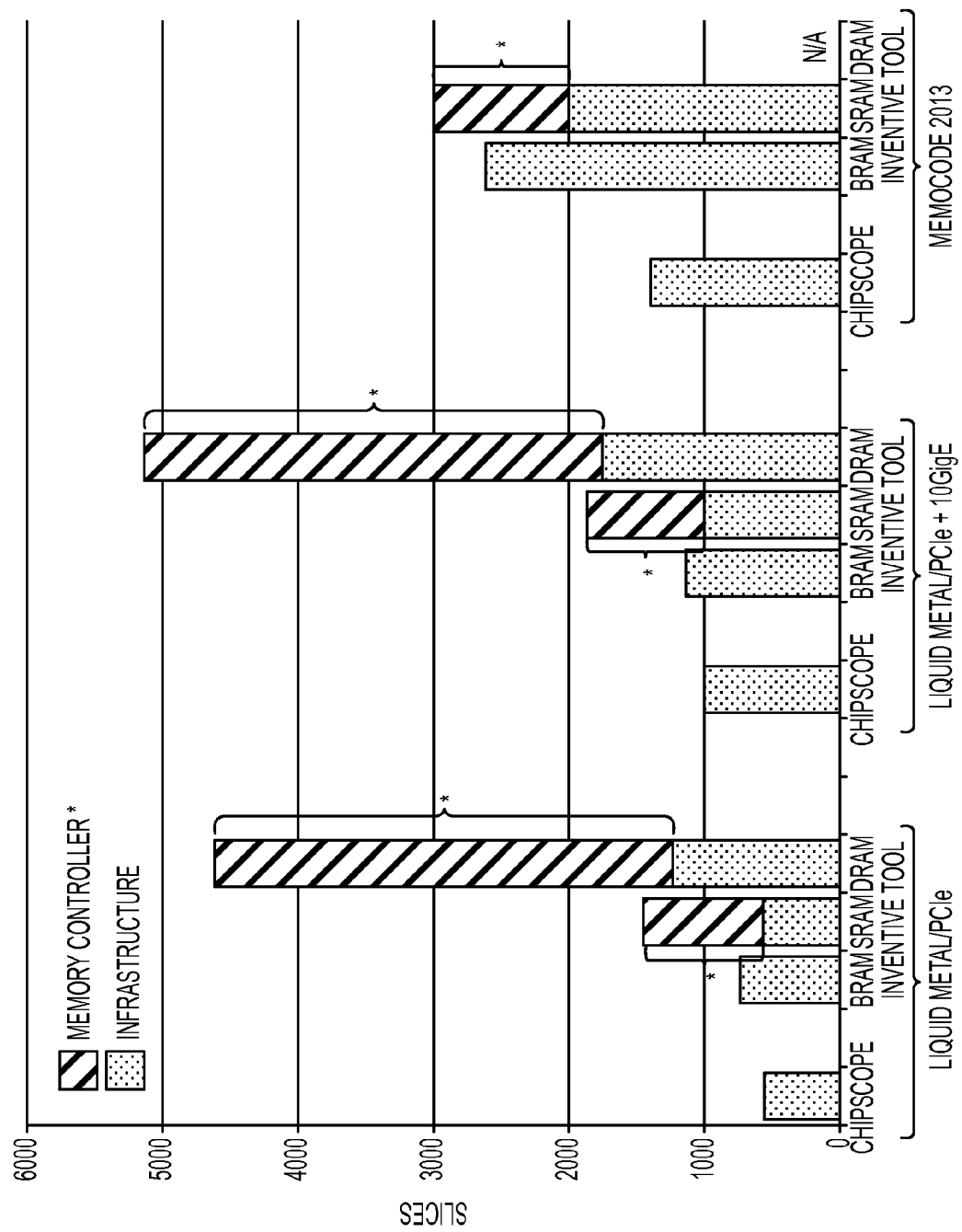
FIG. 4 depicts a results graph according to an embodiment of the present invention.

FIG. 4 shows the Logic resource utilization in slices. The slice count is broken down into the logic required by the CHIPSCOPE or the inventive tool logging infrastructure itself ("Infrastructure") from the IP block for the external memory ("Memory Controller"), in the configurations where it is used.

First, it is seen that the largest difference in slice usage between CHIPSCOPE and the inventive tool is due to the memory controllers themselves. The DRAM controller in particular consumes around 3000 slices, while the SRAM controller consumes around 1000 slices. The DRAM controller is larger (around 3000 slices versus around 1000 slices)

both because DRAM is inherently more complex, but also because on the NALLATECH board it has a much wider burst size and uses more IO pins.

Second, slice count increases for both CHIPSCOPE and the inventive tool as the width and number of debug channels increases, which is to be expected.

Third, depending on the configuration, the inventive tool may use more slices than CHIPSCOPE, depending both on the configuration and the memory interface cost.

Overall, the inventive tool generally consumes more on-chip logic than CHIPSCOPE, but differences are dominated by the memory controller. In those cases, the trade-off is that the external memory provides a log which is orders of magnitude larger, as shown below. For the KINTEX 7 chip that was used, even the largest inventive tool configuration only consumed 10.1% of the slices on the chip (versus 1.9% for CHIPSCOPE). Overhead can become an issue on smaller devices.

Figure 5:
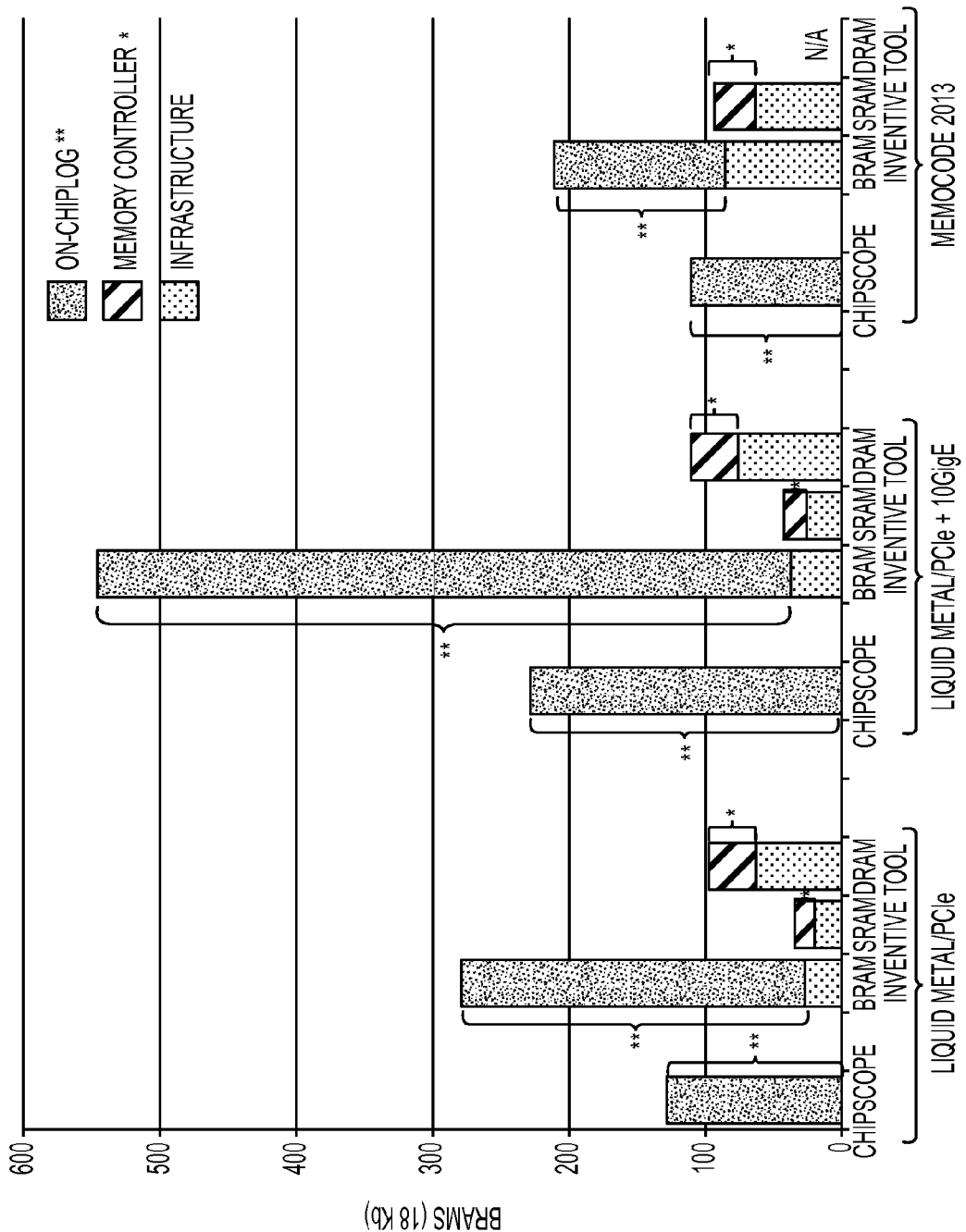
FIG. 5 depicts a results graph according to an embodiment of the present invention.

FIG. 5 shows the Block RAM resource utilization. In addition to breaking down BRAM usage due to the Infastructure and Memory Controller, also shown is BRAM usage for the log itself, when the log is being stored in BRAM rather than off-chip (CHIPSCOPE and the inventive tool /BRAM). For CHIPSCOPE, there is not visibility into the design so all BRAMs are attributed to the log; it is believed that a small number are used for buffering.

Also note that for the MEMOCODE benchmark, because the log entries are wider, the BRAM logs were configured for 1K entries (compared to 8K for the other applications), since otherwise neither CHIPSCOPE nor the inventive tool /BRAM was able to fit.

The key insight from these measurements is that when logging to external memory, significantly fewer BRAMs can be used than when logging to the BRAM itself. This is important to quantify. Since the DRAM module is more complex, it consumes more BRAMs than the SRAM module.

Even though the inventive tool consumes more slices, it consumes fewer BRAMs when logging off-chip—while providing greatly expanded log size and greater functionality.

Due to the inventive tool being complex, when logging to BRAM, there is a penalty paid for the infrastructure. The inventive tool records not only data but also timestamp and channel identifier, making the log entries larger in size. This can be seen particularly in the two LIQUID METAL benchmarks (see FIG. 5), where the inventive tool /BRAM configuration consumes almost twice as many BRAMs as CHIPSCOPE. For the MEMOCODE benchmark, since the channels are wider, the timestamps consume proportionally less data and the imbalance is smaller.

However, since the inventive tool uses a single log buffer, the comparison is not entirely one-to-one. When applications record a variable number of entries on the different channels, the inventive tool's use of a single log avoids fragmentation and may allow lower resource utilization in practice.

FIG. 6 shows a table exhibiting the frequency. To measure the impact of debug instrumentation on the synthesized clock frequency of the benchmarks, each of the benchmarks was iteratively synthesized without any instrumentation ("Base") until the maximum clock frequency was achieved. The benchmarks were then instrumented with the inventive tool and the three inventive tool configurations at that target frequency. For the inventive tool, since the data logging is in a different clock domain, synthesis was attempted to maximize the clock frequency of the inventive tool without impacting the target frequency of the benchmarks.

Referring to the Table of FIG. 6, it is seen that this Table shows the synthesized clock frequency for CHIPSCOPE and the three inventive tool configurations for all the benchmarks. As discussed above, MEMOCODE2013 benchmark cannot be used for logging since it uses DRAM to store application specific data.

The CHIPSCOPE-based design was able to meet the target clock frequency of the "Base" design for all the benchmarks except MERSENNE. Instrumenting MERSENNE benchmark with CHIPSCOPE led to a timing error. While CHIPSCOPE-based design suffered from frequency degradation, instrumenting the "Base" design with the three inventive tool configurations did not result in frequency degradation for any of the benchmarks. However, the Table of FIG. 6 shows the clock frequency in the inventive tool clock domain decreases as the number and width of the debug channels increases.

Running the inventive tool logic at the highest frequency as possible mitigates the backpressure on the debug channel buffers (ideally, the frequency of the inventive tool should match the throughput of the backing store). The timing report after synthesis was analyzed and it was found that the longest critical path in the inventive tool is in the selection and serialization logic of debug data from different channels.

Reference will now be made to dynamic measurements of the benchmarks running under the different logging configurations.

According to the present invention, a property of interest is the length of time it takes an execution to be logged and replayed. This is influenced by three factors: the natural length of execution of the application, the size of the log memory, and the ability of the logging infrastructure to keep up with the data and properly buffer it and stream it to the log.

In some cases, if the application and the instrumentation are producing data at a high, sustained rate, it can be impossible for the log to keep up.

The results are shown in the Table of FIG. 7. For each configuration, it is reported how much "clean" log data was recorded: that is, until logging was stopped either because the application finished ("Completed"), the log buffer become full ("Overflow") or the logging module was unable to keep up ("Drop") in which case the report includes the real time at which this occurred in the execution.

In general, BRAM logs, whether for CHIPSCOPE or the inventive tool, are limited by capacity and almost always overflow (see the tabulation in FIG. 7). The inventive tool, when logging to SRAM results in one of the following three conditions: (1) successfully logs the trace as in the case of DES and N-BODY; (2) results in overflow as in the case of UDP; (3) drops data as in the case of GZip, MERSENNE, and MEMOCODE The overflow and dropping of data is due to the relatively low bandwidth of the SRAM memory on the NALLATECH 287 board.

On the other hand, when used with DRAM, the inventive tool usually completes the application because of the DRAM's larger memory space, which allows the full trace to be recorded, and the wide DRAM interface allows log data to be streamed out as fast as it is created.

Figure 8:
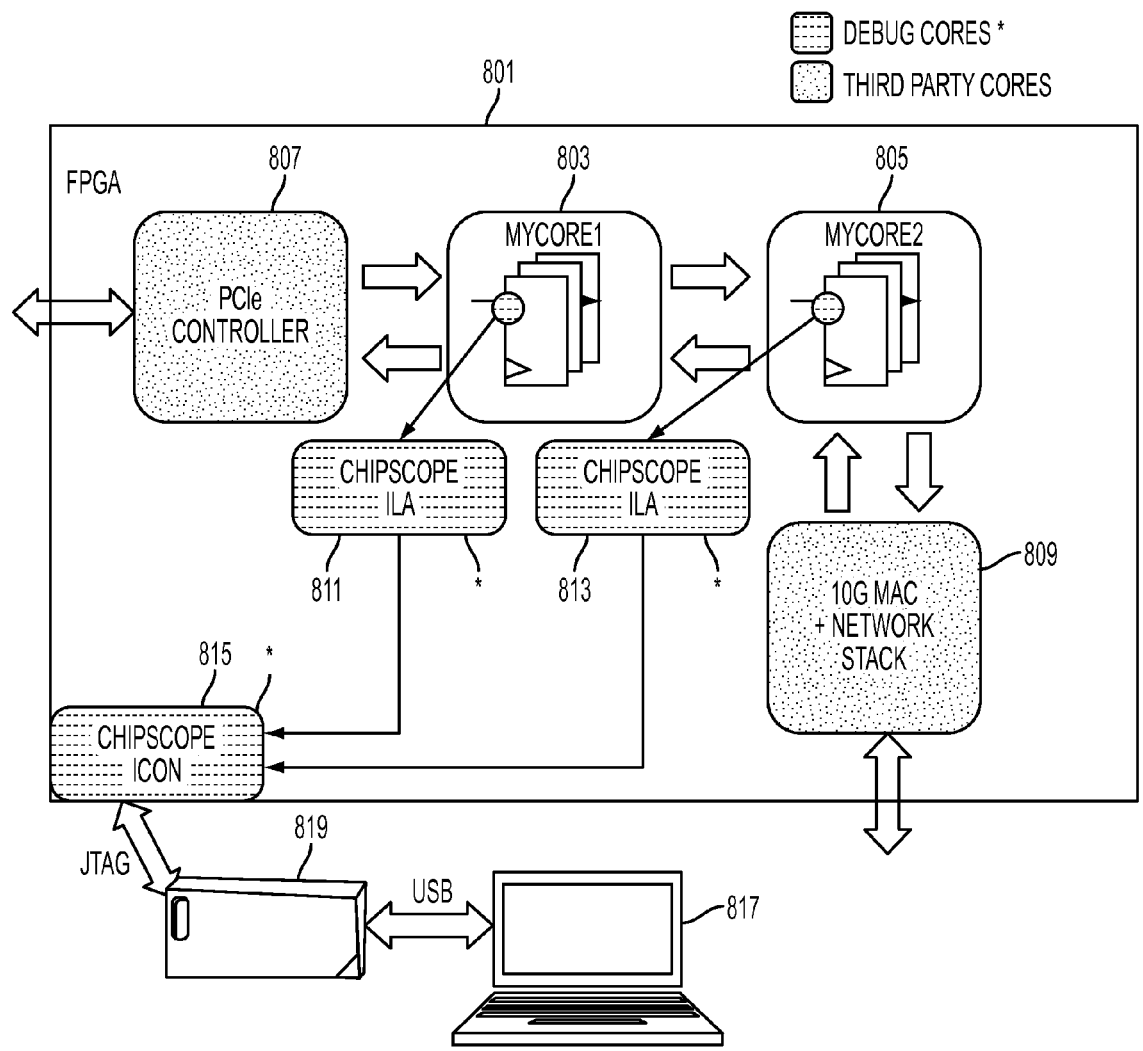
FIG. 8 depicts a block diagram of a conventional system.

FIG. 8 shows a block diagram of a conventional system. As seen, FPGA 801 includes core 803, core 805, PCIe controller 807, 10G MAC+network stack 809 CHIPSCOPE ILA 811, CHIPSCOPE ILA 813 and CHIPSCOPE ICON 815. In addition, host 817 communicates via communication device 819 with CHIPSCOPE ICON 815.

Figure 9:
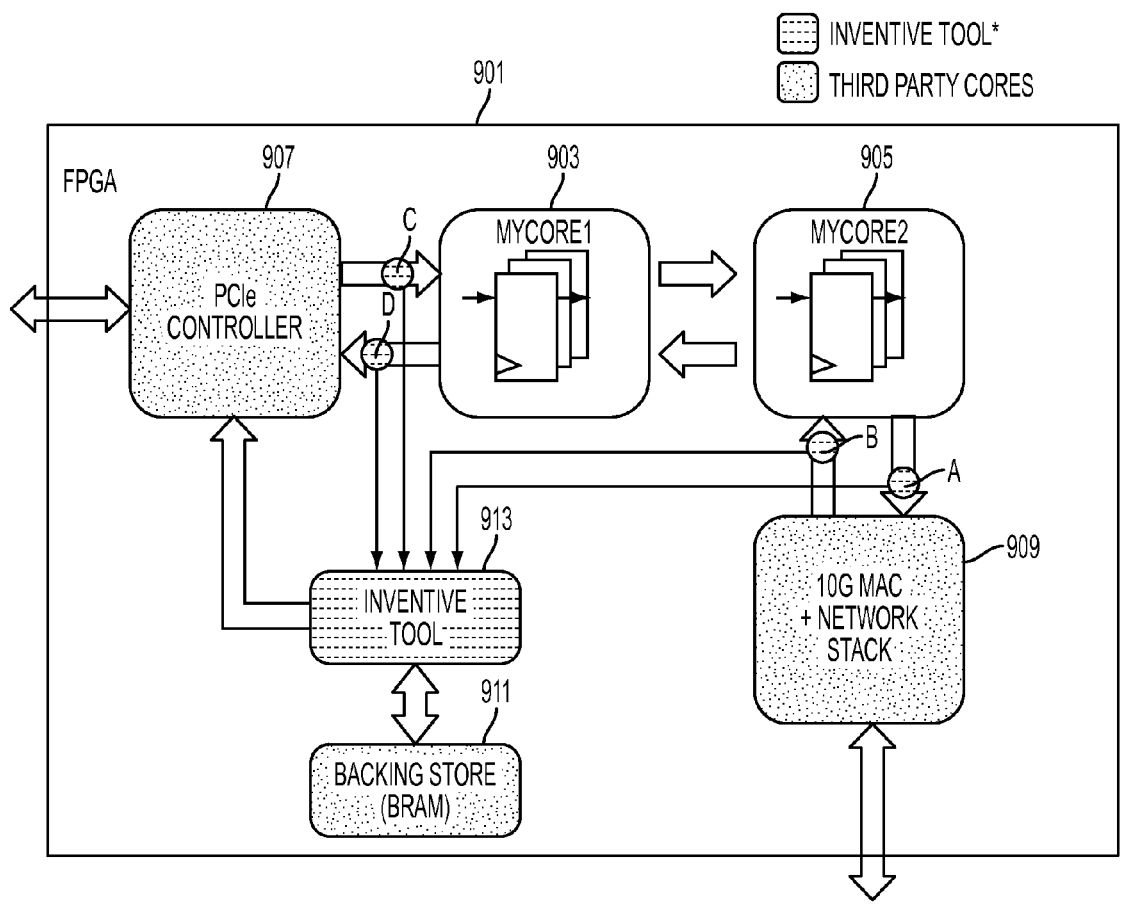
FIG. 9 depicts a block diagram of a system according to an embodiment of the present invention.

FIG. 9 shows a block diagram of a system according to one embodiment. As seen, FPGA 901 includes core 903, core 905, PCIe controller 907, 10G MAC+network stack 909, backing store 911 (on FPGA 901) and the inventive tool 913. The inventive tool 913 obtains data (e.g., debug data) at, for example, points A, B, C and D. In addition, the inventive tool 913 carries out data communication with backing store 911 and PCIe controller 907 (which, in turn, may communicate with elements outside the FPGA (e.g., a host such as a laptop computer, a desktop computer, a server or the like)).

Figure 10:
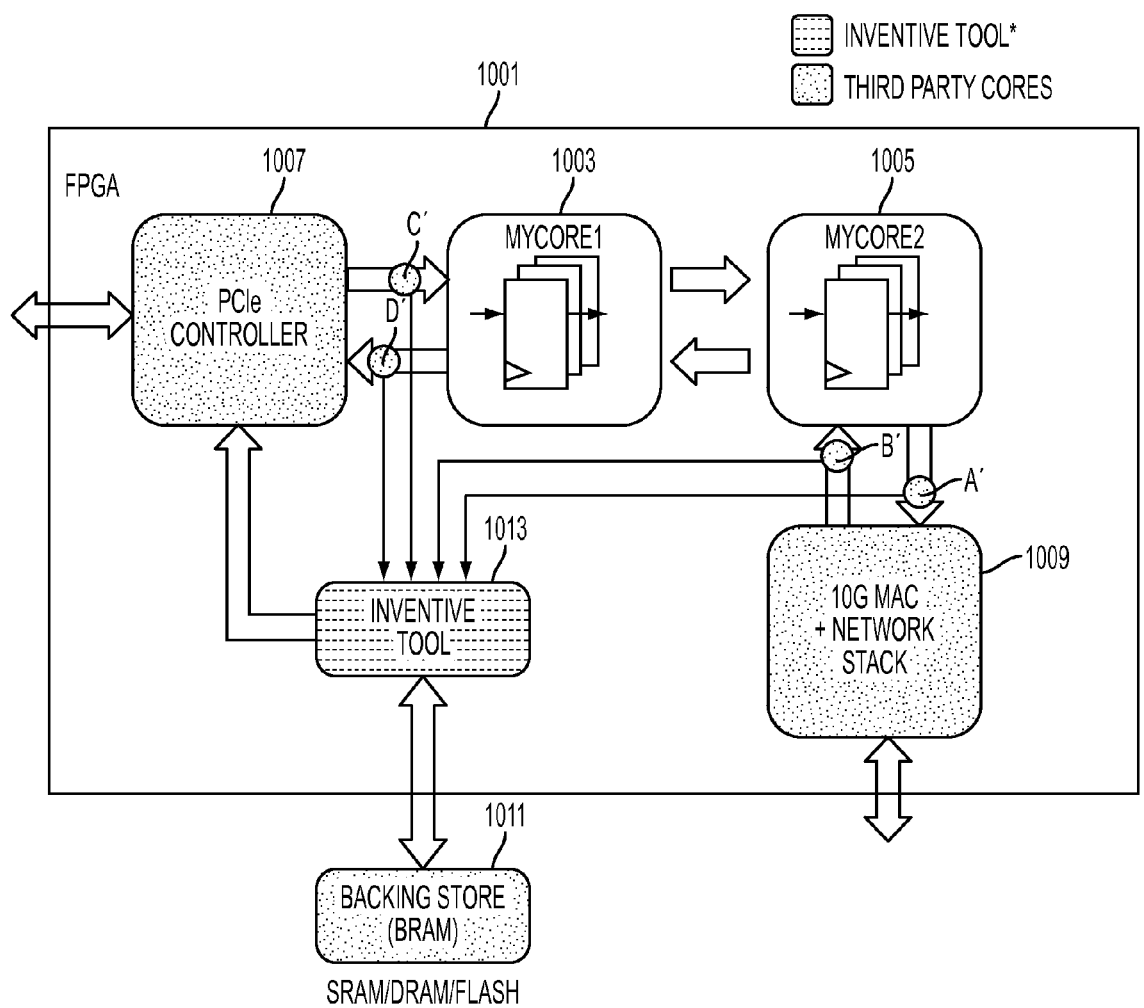
FIG. 10 depicts a block diagram of a system according to an embodiment of the present invention.

FIG. 10 shows a block diagram of a system according to another embodiment of the present invention. As seen, FPGA 1001 includes core 1003, core 1005, PCIe controller 1007, 10G MAC+network stack 1009, backing store 1011 (external to FPGA 1001) and the inventive tool 1013. The inventive tool 1013 obtains data (e.g., debug data) at, for example, points A', B', C' and D'. In addition, the inventive tool 1013 carries out data communication with backing store 1011 and PCIe controller 1007 (which, in turn may communicate with elements outside the FPGA (e.g., a host such as a laptop computer, a desktop computer, a server or the like)).

In an embodiment of the present invention, the read back of the log data, from the FPGA to the host including, e.g., a processor can be in-band. That is, both data and debug information can be communicated over the same communication interface between the host and FPGA (this in-band communication may or may not perturb timing behavior of the host, the FPGA and/or the hardware-software co-execution).

In another embodiment of the present invention, the read back of the log data (from the FPGA to the host (including, e.g., a processor)) may be out-of-band. That is, each of the data and the debug information can be communicated over separate communication interfaces. That is, data may be communicated between the host and FPGA over a first communication interface and the debug information may be communicated between the host and FPGA over a second, different communication interface (e.g., an Ethernet interface for debugging). In various examples, this can provide non-intrusive read back and/or can be used to implement read back as a service via the Ethernet interface for remote debugging.

In another embodiment of the present invention, the log can be communicated to the host (including, e.g., a processor): (a) during a runtime of the hardware-software co-execution system; (b) at the end of execution by the hardware-software co-execution system; or (c) a combination thereof.

In another embodiment of the present invention, the log can be communicated to host (including, e.g., a processor) over an Ethernet channel as a UDP/TCP service.

In another embodiment of the present invention, any steps described herein may be carried out in any appropriate desired order.

As described herein is the design and implementation of a tool which is a non-intrusive, FPGA-agnostic debugging framework for running FPGA systems.

As described herein is a replay mechanism to reproduce a cycle accurate system-wide simulation of events as they happened in FPGA. This makes the whole design visible rather than just the points being tapped.

As described herein is a static performance evaluation showing the area and BRAM overhead of the inventive tool in absolute terms and relative to XILINX CHIPSCOPE, and demonstrating the inventive tool's lack of impact on clock frequency.

As described herein is a dynamic performance evaluation showing how long an execution can be recorded and replayed by the inventive tool for a number of different benchmarks.

As described herein, trace-based execution playback in a hardware-software co-execution system (the hardware-software co-execution system comprising at least one processor and at least one FPGA) may be implemented in the form of systems, methods and/or algorithms.

In one embodiment, operation can be as follows: Create a trace of events (along with timestamps) happening at the hardware-software boundary. Use the trace to replay the sequence of events in a hardware simulation on a host machine for debug and/or performance analysis purposes. In one specific example, the reproduction of events is a 100% clock cycle accurate reproduction of events for the whole system (not just the tap points). In another specific example, virtually unlimited trace storage capability may be provided by using off-chip memory storage (e.g., DDR-SDRAM/QDR-SRAM). In another specific example, the trace can be communicated to the host during runtime and/or at the end of execution. In another specific example, the trace can be collected from the FPGA remotely over an Ethernet channel as a UDP/TCP service.

Figure 11:
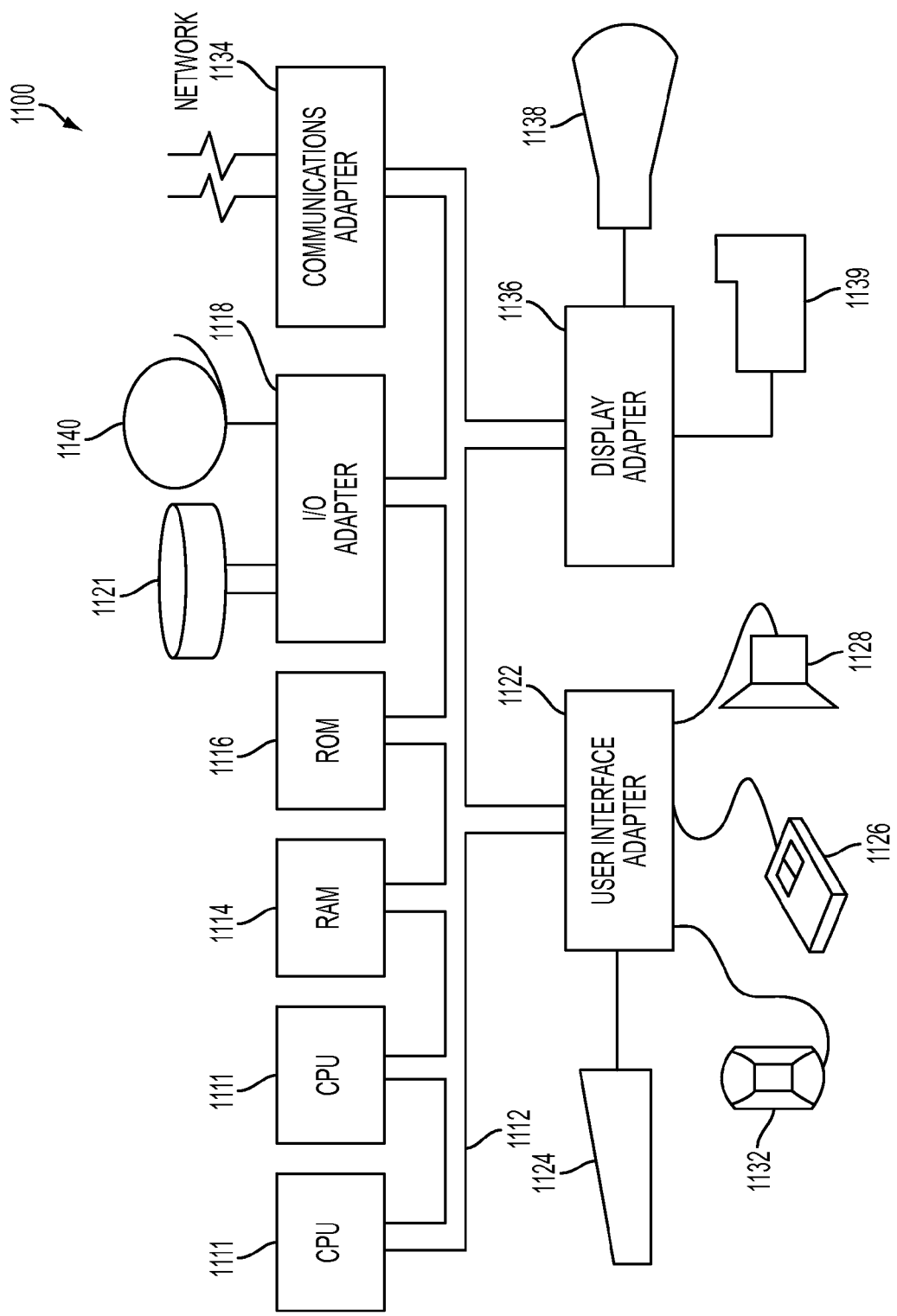
FIG. 11 depicts a block diagram of a system according to an embodiment of the present invention.

FIG. 11 shows a hardware configuration of computing system 1100 according to an embodiment of the present invention. As seen, this hardware configuration has at least one processor or central processing unit (CPU) 1111. The CPUs 1111 are interconnected via a system bus 1112 to a random access memory (RAM) 1114, read-only memory (ROM) 1116, input/output (I/O) adapter 1118 (for connecting peripheral devices such as disk units 1121 and tape drives 1140 to the bus 1112), user interface adapter 1122 (for connecting a keyboard 1124, mouse 1126, speaker 1128, microphone 1132, and/or other user interface device to the bus 1112), a communications adapter 1134 for connecting the system 1100 to a data processing network, the Internet, an Intranet, a local area network (LAN), etc., and a display adapter 1136 for connecting the bus 1112 to a display device 1138 and/or printer 1139 (e.g., a digital printer or the like).

In various examples, the disclosed mechanisms can be used to evaluate the performance at a fine-grained level. In various examples, the log can be read back into the host to which the FPGA is connected to and/or the log could be read back remotely using a network interface (this facilitates remote analysis/debugging of designs).

As described herein, various embodiments may operate in the context of: compilers, development tools, software environments, software testing, software maintenance, programming languages, interpreters, program analysis, object technology and/or garbage collection.

As described herein, various embodiments may operate in the context of: computer-embedded systems; computer-hardware; computer-software; computer-server; computer-workstation.

As described herein, various embodiments may provide for the probing of internal logic.

As described herein, the inventive tool framework can record data at key points in an FPGA design and then use a trace to run a cycle accurate simulation of the whole design. It has been shown that inventive tool is non-intrusive to the user application both in terms of its impact on application's synthesizable frequency and the runtime behavior. Unlike most of the typical alternatives, inventive tool can, in one example, be used with FPGAs from any vendor. The inventive tool complements the HLS framework in providing a comprehensive solution to debugging functional and runtime bugs.

In another example, the inventive tool uses the communication channel but only either at the end of the application or when the application is idle.

In another example, logs (traces) may be sent to the host in real-time and/or in a batch process.

As described herein is a framework for cycle accurate record and replay of running FPGA systems to do debugging and performance analysis.

As described herein is an FPGA-based runtime component and a host-based post processor (e.g., for analysis).

As described herein is a framework that can simulate a particular channel with a cycle-accurate reproduction.

As described herein is a framework to use the trace to do a cycle accurate HDL simulation for performance analysis and/or debugging a failing test case.

In another example, mechanisms are provided: (a) to reduce overhead (e.g., delta encoding of timestamps, source side data); (b) for logging (host)+timestamping (FPGA); (c) for remote debugging (e.g., as a service over network); (d) for advancing simulation; and/or (e) for RAS (Reliability, Availability, and Serviceability) support.

As described herein is a tool that logs non-deterministic data and timing information, extracts it from the FPGA, and uses it for cycle-accurate replay of the entire execution in simulation. In one example, this allows interactive debugging with full visibility into the design.

As described herein are measurements showing that inventive tool does not affect synthesizable clock frequency, therefore providing completely non-intrusive instrumentation. When logging to external memory, the inventive tool consumes fewer BRAMs than XILINX CHIPSCOPE while logging several orders of magnitude more data and providing full replay capability, at the cost of a modest amount of additional logic, primarily due to the memory controller itself.

Figure 12:
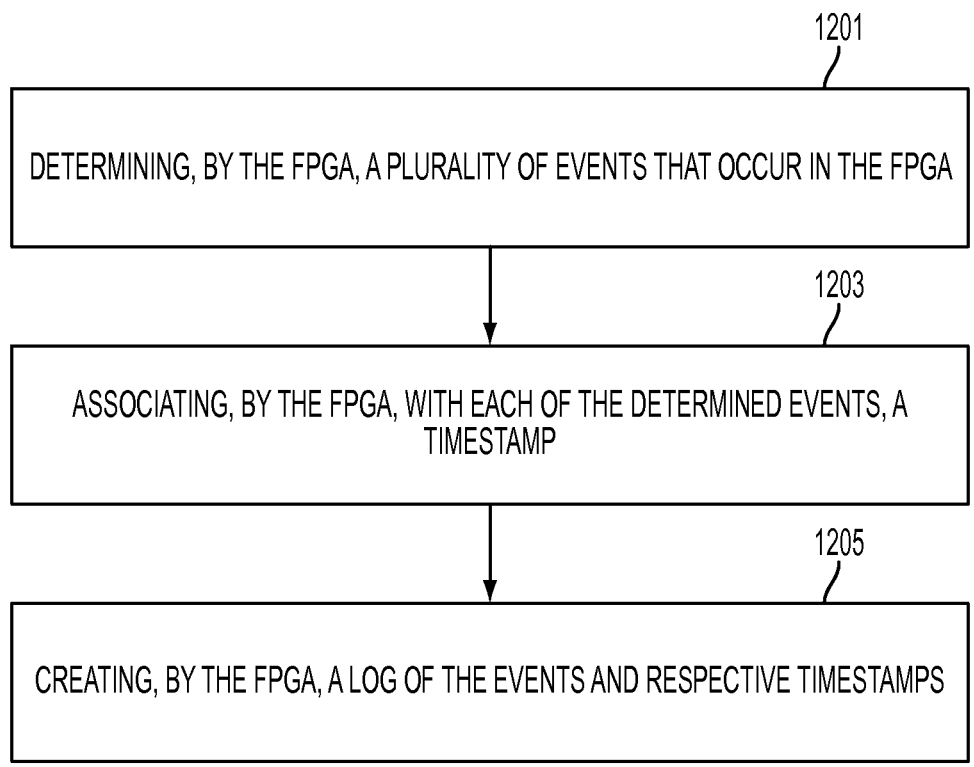
FIG. 12 depicts a block diagram of a method according to an embodiment of the present invention.

FIG. 12 shows a method implemented at least in part in an FPGA for analyzing the FPGA. As seen in this FIG. 12, the method of this embodiment comprises: at 1201—determining, by the FPGA, a plurality of events that occur in the FPGA; at 1203—associating, by the FPGA, a timestamp with each of the determined events; and at 1205—creating, by the FPGA, a log of the events and respective timestamps.

According to the present invention, any steps may be carried out in the order recited or the steps may be carried out in another order.

FIG. 13 shows a computer-implemented system 1300 for analyzing an FPGA based upon a log of FPGA events and respective timestamps. This system may include the following elements: an input element 1301 configured to receive the log; a replay element 1303 configured to utilize the log to replay a prior FPGA execution in a simulation; and an output element 1305 configured to output the simulation.

Referring to FIG. 13, each of the elements may be operatively connected together via system bus 1302. In one example, communication between and among the various elements may be bi-directional. In another example, communication may be carried out via network 1307 (e.g., the Internet, an intranet, a local area network, a wide area network and/or any other desired communication channel(s)). In another example, some or all of these elements may be implemented in a computer system of the type shown in FIG. 11.

In another embodiment a method implemented at least in part in a field-programmable gate array (FPGA) for analyzing the FPGA is provided, the method comprising: determining, by the FPGA, a plurality of events that occur in the FPGA; associating, by the FPGA, a timestamp with each of the determined events; and creating, by the FPGA, a log of the events and respective timestamps.

In one example, the method further comprises utilizing the log to replay a prior FPGA execution in a simulation (in one example, this would reproduce what happens between events).

In another example, the log is utilized by a host computer to replay the prior FPGA execution in the simulation.

In another example, the replay of the prior FPGA execution in the simulation is used for at least one of: (a) debugging; (b) performance analysis; and (c) a combination thereof.

In another example, a reproduction of the prior FPGA execution for simulation is a 100 percent clock cycle accurate reproduction.

In another example, the log is stored in at least one of: (a) an internal memory of the FPGA; (b) a memory external to the FPGA; and (c) a combination thereof.

In another example, the log is communicated to the host computer at a time selected from: (a) real-time, as a process progresses in the FPGA; (b) in a batch, after a process had completed in the FPGA; and (c) a combination thereof.

In another embodiment a computer program product for analyzing a field-programmable gate array (FPGA) is provided, the computer program product comprising a computer readable storage medium having program instructions embodied therewith, the program instructions executable at least in part by the FPGA to cause the FPGA to perform a method comprising: determining a plurality of events that occur in the FPGA; associating a timestamp with each of the determined events; and creating a log of the events and respective timestamps.

In one example, the program instructions are executable by a computer to cause the computer to perform a method comprising utilizing the log to replay a prior FPGA execution in a simulation.

In another example, the log is communicated to the host computer at a time selected from: (a) real-time, as a process progresses in the FPGA; (b) in a batch, after a process had completed in the FPGA; and (c) a combination thereof.

In another embodiment a computer-implemented system for analyzing a field-programmable gate array (FPGA) based upon a log of FPGA events and respective timestamps is provided, the system comprising: an input element configured to receive the log; a replay element configured to utilize the log to replay a prior FPGA execution in a simulation (in one example, this would reproduce what happens between events); and an output element to output the simulation.

In another example, the log is communicated to a host computer at a time selected from: (a) real-time, as a process progresses in the FPGA; (b) in a batch, after a process had completed in the FPGA; and (c) a combination thereof.

In another example, the output element to output the simulation comprises a display.

In another embodiment, a method for analyzing a field-programmable gate array (FPGA) is provided, the method comprising: determining a plurality of events that occur in the FPGA; associating, a timestamp with each of the determined events; creating a log of the events and respective timestamps; and utilizing the log to replay a prior FPGA execution in a simulation. In one example, each of the determining, associating and creating is performed by the FPGA and the utilizing the log to replay is performed by a host computer or the like.

In another embodiment a computer program product for analyzing a field-programmable gate array (FPGA) is provided, the computer program product comprising a computer readable storage medium having program instructions embodied therewith, the program instructions executable at least in part by the FPGA to cause the FPGA to perform a method comprising: determining a plurality of events that occur in the FPGA; associating a timestamp with each of the determined events; and creating a log of the events and respective timestamps.

In another embodiment, a computer system for analyzing a field-programmable gate array (FPGA) based upon a log of FPGA events and respective timestamps is provided, the computer system comprising: an input element configured to receive the log, a replay element configured to utilize the log to replay a prior FPGA execution in a simulation and an output element to output the simulation (e.g., display the simulation).

In other examples, various embodiments may be applied in the context of multiple FPGAs (e.g., a multi-FPGA system).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It is noted that the foregoing has outlined some of the objects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the features and applications of the invention. Other beneficial results can be realized by applying the disclosed invention in a different manner or modifying the invention in ways known to those familiar with the art. In addition, all of the examples disclosed herein are intended to be illustrative, and not restrictive.

What is claimed is:

1. A method for analyzing a hardware circuit implemented in a field-programmable gate array (FPGA), the method comprising:
   determining, by the FPGA, a plurality of events that occur in the FPGA;
   associating, by the FPGA, a timestamp with each of the determined events;
   creating, by the FPGA, a log of the events and respective timestamps;
   receiving, by a computer, the log;
   utilizing, by the computer, the log to replay a prior FPGA execution in a simulation, wherein the replay is based upon non-deterministic input data and timing information in the log, and wherein the replay is performed using a hardware description language (HDL) code which is the same as that used to configure the FPGA after synthesis; and
   outputting, by the computer, the simulation.

2. The method of claim 1, wherein the computer is a host computer.

3. The method of claim 2, wherein the log is communicated to the host computer at a time selected from: (a) real-time, as a process progresses in the FPGA; (b) in a batch, after a process had completed in the FPGA; and (c) a combination thereof.

4. The method of claim 1, wherein the replay of the prior FPGA execution in simulation is used for at least one of: (a) debugging; (b) performance analysis; and (c) a combination thereof.

5. The method of claim 1, wherein a reproduction of the prior FPGA execution in simulation is a 100 percent clock cycle accurate reproduction.

6. The method of claim 1, wherein the log during execution is stored in at least one of: (a) an internal memory of the FPGA; (b) a memory external to the FPGA; and (c) a combination thereof.

7. The method of claim 1, wherein the simulation is output by the computer to a display.

8. A computer program product for analyzing a hardware circuit implemented in a field-programmable gate array (FPGA), the computer program product comprising:
   (a) a first computer readable storage medium having program instructions embodied therewith, the program instructions of the first computer readable storage medium executable at least in part by the FPGA to cause the FPGA to perform a method comprising:
   determining a plurality of events that occur in the FPGA;
   associating a timestamp with each of the determined events; and
   creating a log of the events and respective timestamps; and
   (b) a second computer readable storage medium having program instructions embodied therewith, the program instructions of the second computer readable storage medium executable at least in part by a computer to cause the computer to perform a method comprising:
   receiving the log;
   utilizing the log to replay a prior FPGA execution in a simulation, wherein the replay is based upon non-deterministic input data and timing information in the log, and wherein the replay is performed using a hardware description language (HDL) code which is the same as that used to configure the FPGA after synthesis; and
   outputting the simulation.

9. The computer program product of claim 8, wherein the computer is a host computer.

10. The computer program product of claim 9, wherein the log is communicated to the host computer at a time selected from: (a) real-time, as a process progresses in the FPGA; (b) in a batch, after a process had completed in the FPGA; and (c) a combination thereof.

11. The computer program product of claim 8, wherein the replay of the prior FPGA execution in simulation is used for at least one of: (a) debugging; (b) performance analysis; and (c) a combination thereof.

12. The computer program product of claim 8, wherein a reproduction of the prior FPGA execution in simulation is a 100 percent clock cycle accurate reproduction.

13. The computer program product of claim 8, wherein the log during execution is stored in at least one of: (a) an internal memory of the FPGA; (b) a memory external to the FPGA; and (c) a combination thereof.

14. The computer program product of claim 8, wherein the simulation is output by the computer to a display.

* * * * *